United States Patent
Saiki et al.

(10) Patent No.: US 7,674,859 B2
(45) Date of Patent: Mar. 9, 2010

(54) ADHESIVE COMPOSITION AND ADHESIVE SHEET

(75) Inventors: Naoya Saiki, Tokyo (JP); Isao Ichikawa, Tokyo (JP); Hironori Shizuhata, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 12/144,912

(22) Filed: Jun. 24, 2008

(65) Prior Publication Data

US 2009/0004829 A1    Jan. 1, 2009

(30) Foreign Application Priority Data

Jun. 28, 2007   (JP) .............................. 2007-170653

(51) Int. Cl.
  *B32B 27/30* (2006.01)
  *C08L 33/14* (2006.01)
  *C08L 33/10* (2006.01)

(52) U.S. Cl. ....................... 525/109; 428/413; 525/113; 525/114; 525/118

(58) Field of Classification Search ....................... None
See application file for complete search history.

(56) References Cited

U.S. PATENT DOCUMENTS

| | | | |
|---|---|---|---|
| 5,110,388 A | 5/1992 | Komiyama et al. | |
| 5,118,567 A | 6/1992 | Komiyama et al. | |
| 5,356,949 A | 10/1994 | Komiyama et al. | |
| 6,277,481 B1 | 8/2001 | Sugino et al. | |

| | | | |
|---|---|---|---|
| 2007/0238802 A1 * | 10/2007 | Harada et al. | 522/75 |

FOREIGN PATENT DOCUMENTS

| | | | |
|---|---|---|---|
| EP | 0359373 A2 | | 3/1990 |
| EP | 0971011 A2 | | 1/2000 |
| JP | 2032181 A | | 2/1990 |
| JP | 8239636 A | | 9/1996 |
| JP | 10008001 A | | 1/1998 |
| JP | 2000017246 A | | 1/2000 |
| JP | 2002-12819 A | * | 1/2002 |
| JP | 2004-69930 A | * | 3/2004 |
| JP | 2006-335860 A | * | 12/2006 |
| JP | 2006335860 A | | 12/2006 |

OTHER PUBLICATIONS

HCAPLUS accession No. 2002:584145 and Derwent accession No. 2006-753354 for RD 459,148 A, IBM Corporation, Jul. 10, 2002, two pages.*

* cited by examiner

*Primary Examiner*—Robert Sellers
(74) *Attorney, Agent, or Firm*—The Webb Law Firm

(57) ABSTRACT

An adhesive sheet which can actualize a high package reliability wherein there is no separation at the adhesive interface and no package cracking, in a package in which a semiconductor chip being reduced in thickness is mounted under severe reflow conditions after exposure to a hot and humid environment. The adhesive sheet includes a base material and, formed thereon, an adhesive layer having an adhesive composition including an acrylic copolymer (A) containing 20 to 95% by weight of a structural unit derived from a benzyl (meth)acrylate, an epoxy thermosetting resin (B), and a thermosetting agent (C).

2 Claims, No Drawings

ADHESIVE COMPOSITION AND ADHESIVE SHEET

BACKGROUND OF THE INVENTION

1. Field of the Invention

The present invention relates to an adhesive composition which is particularly suited for using at a step of die-bonding a semiconductor device (semiconductor chip) on an organic substrate or a lead frame and a step of dicing a silicon wafer and the like and die-bonding a semiconductor chip on an organic substrate or a lead frame, an adhesive sheet having an adhesive layer comprising the above adhesive composition and a production process for a semiconductor device using the above adhesive sheet.

2. Description of the Related Art

A semiconductor wafer of silicon, gallium arsenide or the like is cut and separated (dicing) into small pieces (IC chips) of devices and then transferred to a bonding step which is a subsequent step. In this case, the semiconductor wafer is subjected to the respective steps of dicing, washing, drying, expanding and picking-up in the state that it is adhered in advance on an adhesive sheet, and then it is transferred to a bonding step which is a subsequent step. Furthermore, for such purposes as protecting a semiconductor chip from the surrounding environment and making it into a shape easily mountable on a print board, a semiconductor package is produced, in some cases, by sealing a substrate on which an IC chip is bonded with a mold resin after the bonding step.

In order to simplify the picking-up step and the bonding step among the above steps, for example, adhesive sheets for dicing and die-bonding which are described in patent documents 1 to 4 and which are provided with both a wafer-fixing function and a die-adhering function are proposed.

Adhesive sheets comprising an adhesive layer comprising a specific composition and a base material are disclosed in the patent documents 1 to 4. The above adhesive layer has a function of fixing a wafer in dicing the wafer, and irradiation thereof with an energy beam reduces an adhesive strength thereof and makes it possible to control the adhesive strength between the adhesive layer and the base material, so that when picking up the chip after finishing dicing, the adhesive layer is peeled off together with the chip. When the IC chip provided with the adhesive layer is mounted on a substrate and heated, an adhesive strength of a thermosetting resin contained in the adhesive layer is revealed to complete adhesion between the IC chip and the substrate.

The adhesive sheets disclosed in the patent documents described above enables so-called direct die-bonding and makes it possible to omit a step of coating an adhesive for adhering a die.

On the other hand, very severe physical properties are required to semiconductor devices in recent years. For example, package reliability under severe hot and humid environment is required in an examination of a term of quality assurance. However, a reduction in a thickness of a semiconductor chip itself results in a reduction in a strength of the chip, and the package reliability under severe hot and humid environment has not necessarily been satisfactory.

In a surface mounting carried out in connection of electronic parts in recent years, a surface mounting method in which the whole part of a package is exposed to high temperature of not lower than a melting point of a solder is carried out(reflow process). In recent years, a mounting temperature is elevated from 240° C. which has so far been carried out to 26° C. due to transfer to a solder containing no lead from the viewpoint of attentions to the environment to increase a stress produced in the inside of a semiconductor package, and the risk of producing peeling of adhesive interface between a semiconductor chip and an adhesive sheet and package crack is further elevated.

In other words, an adhesive sheet is required whose quality such as an adhesive strength does not deteriorate even exposed to severe hot and humid environment and which does not cause package crack and the like even exposed to a high temperature condition of 260° C. after that, that is, can achieve high package reliability, as well as enables the so-called direct die-bonding as aforementioned.

As a technology to meet the tough requirements for physical properties, especially requirements for resistance to hot and humid environment, for example, Patent Document 3 discloses an adhesive tape having an adhesive layer formed from an energy beam-curable adhesive component, an epoxy resin and a phenol resin.

In Patent Document 3, the energy beam-curable adhesive component mentioned above is exemplified by a (meth)acrylate copolymer comprising such a constitutional unit derived from a (meth)acrylate monomer and the like and there is described that the epoxy resin acquires a property of firmly adhering an adherend upon heating and that the phenol resin reacts with the epoxy resin upon heating to form a cured product.

Furthermore, Example 5 of Patent Document 5 discloses an adhesive composition containing an acrylic copolymer, an epoxy resin and a heat-activatable latent epoxy resin curing agent (phenol resin). On the other hand, Patent Documents 2, 4, 5 and the like disclose a benzyl(meth)acrylate as an example of a (meth)acrylate monomer used for constituting an adhesive component.

However, there are no specific descriptions about the amount of benzyl(meth)acrylate to be used and the like in these documents.

Patent document 1: JP-A-1990-32181
Patent document 2: JP-A-1996-239636
Patent document 3: JP-A-1998-8001
Patent document 4: JP-A-2000-17246
Patent document 5: JP-A-2006-335860

SUMMARY OF THE INVENTION

As described above, it is required to actualize a high package reliability that there is no occurrence of peeling of adhesive interface and package crack, in a package in which a semiconductor chip being reduced in a thickness is mounted even when exposed to severe reflow conditions after the exposure to the severe hot and humid environment.

The present invention has been made in light of the conventional arts described above, and an object thereof is to investigate an adhesive used for chip-bonding and meet the requirements described above.

As a result of intensive research to address these problems, inventors of the present invention have found that a certain semiconductor package causes no separation of adhesive interface or package crack even when it is exposed to a hot and humid environment and exposed to a severe reflow conditions. The semiconductor package is produced using an adhesive sheet obtained by forming an adhesive layer of an adhesive composition comprising an acrylic copolymer containing a certain amount of a structural unit derived from a benzyl(meth)acrylate, an epoxy thermosetting resin and a thermosetting agent, on a base material. The inventors of the present invention accomplished the present invention from the finding.

The present invention comprises the following essentials.

[1] An adhesive composition comprising an acrylic copolymer (A) containing 20 to 95% by weight of a structural unit derived from a benzyl(meth)acrylate, an epoxy thermosetting resin (B), and a thermosetting agent (C).

[2] The adhesive composition according to [1] above, wherein the acrylic copolymer (A) contains 3 to 50% by weight of a structural unit derived from a (meth)acrylic ester having a hydroxyl group.

[3] An adhesive sheet comprising a base material and, separably formed thereon, an adhesive layer comprising an acrylic copolymer (A) containing 20 to 95% by weight of a structural unit derived from a benzyl(meth)acrylate, an epoxy thermosetting resin (B), and a thermosetting agent (C).

[4] The adhesive sheet of [3] above, wherein the acrylic copolymer (A) contains 3 to 50% by weight of a structural unit derived from a (meth)acrylic ester having a hydroxyl group.

[5] A production process for a semiconductor device, comprising:
a step of providing an adhesive sheet comprising a base material and, formed thereon, an adhesive layer comprising an acrylic copolymer (A) containing 20 to 95% by weight of a structural unit derived from a benzyl(meth)acrylate, an epoxy thermosetting resin (B), and a thermosetting agent (C);
a step of adhering a semiconductor wafer on the adhesive layer of the adhesive sheet;
a step of dicing the semiconductor wafer;
a step of separating the diced semiconductor wafer from the base material of the adhesive sheet while leaving at least a part of the adhesive layer firmly adhered to the semiconductor wafer;
a step of thermally bonding the separated semiconductor wafer on a die pad part through the adhesive layer which firmly adheres to and remains on the semiconductor wafer.

[6] The production process for a semiconductor device according to [5], wherein the acrylic copolymer (A) contains 3 to 50% by weight of a structural unit derived from a (meth)acrylic ester having a hydroxyl group.

According to the present invention, provided are an adhesive composition which can achieve a high package reliability in a package in which a semiconductor chip being reduced in a thickness is mounted even when exposed to a hot and humid environment and exposed to a severe reflow conditions, an adhesive sheet having an adhesive layer comprising the above adhesive composition and a production process for a semiconductor device using the above adhesive sheet.

DETAILED DESCRIPTION OF THE INVENTION

The adhesive composition, the adhesive sheet and the production process for a semiconductor device of the present invention shall more minutely be explained below.

<Adhesive Composition>

The adhesive composition (hereinafter also referred to merely as "the adhesive") according to the present invention comprises an acrylic copolymer (A) containing 20 to 95% by weight of a structural unit derived from a benzyl(meth)acrylate, an epoxy thermosetting resin (B), and a thermosetting agent (C). The structural unit derived from a benzyl(meth)acrylate is represented by the following formula (1):

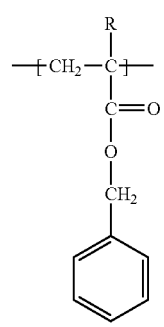

(1)

in the formula (1) above, R represents a hydrogen atom or methyl group.

The adhesive composition of the present invention may contain other components described below in order to improve a variety of the physical properties. The each component shall specifically be explained below.

(A) Acrylic Copolymer:

An acrylic copolymer (A) in the adhesive composition of the present invention contains 20 to 95% by weight of a structural unit derived from benzyl(meth)acrylate. Benzyl (meth)acrylate, because of its highly hydrophobic benzyl group, has low hygroscopicity and thus the structural unit derived from benzyl(meth)acrylate helps decrease the hygroscopicity of an acrylic copolymer as a whole. Furthermore, when benzyl(meth)acrylate is copolymerized, the compatibility of the acrylic copolymer with other components composing the adhesive composition of the present invention is improved.

Because benzyl(meth)acrylate excels also in thermal stability, by copolymerizing benzyl(meth)acrylate in an acrylic copolymer, hygroscopicity of the adhesive composition can be reduced while maintaining the heat resistance of the adhesive composition. One of the reasons for the occurrence of a package crack is thought to be rapid vaporization of water contained in an adhesive of an adhesive sheet, caused by exposure to a hot temperature. Even if put under hot and humid environment, however, the adhesive composition of the present invention hardly absorbs moisture. Therefore, even if a semiconductor package produced by using the adhesive composition is exposed to severe reflow conditions after being put under a hot and humid environment, no package cracks appear on the semiconductor package. Thus, a high package reliability is achieved.

A content of a structural unit derived from benzyl (meth) acrylate is 20 to 95% by weight, preferably 25 to 90% by weight, and more preferably 30 to 85% by weight with respect to the entire acrylic copolymer (A). When the content is lower than 20% by weight, sufficient effect may not be achieved on the maintenance of heat resistance, reduction of hygroscopicity or the like for the adhesive composition. On the other hand, when the content is higher than 95% by weight, the adhesiveness of an adhesive layer comprising the adhesive composition onto a semiconductor wafer may be deteriorated.

The above acrylic copolymer (A) preferably contains a structural unit derived from a (meth)acrylic ester having a hydroxyl group. This is because a structural unit derived from a (meth)acrylic ester having a hydroxyl group shows good compatibility with an epoxy resin, and when the adhesive composition comprises a cross-linking agent (F) described below, good cross-linking property with the cross-linking agent (F) is obtained, This is also because the adhesive strength of a cured product of the adhesive composition to the semiconductor wafer can be increased.

Examples of the (meth)acrylic ester having a hydroxyl group include 2-hydroxyethyl acrylate, 2-hydroxyethyl methacrylate, 2-hydroxypropyl acrylate, 2-hydroxypropyl methacrylate and the like.

The content of the structural unit derived from a (meth) acrylic ester having a hydroxyl group is, with respect to the entire acrylic copolymer (A), preferably 3 to 50% by weight, more preferably 5 to 40% by weight, still more preferably 10 to 30% by weight.

Examples of other monomer for the acrylic copolymer (A) include (meth)acrylic acid, (meth)acrylic esters and derivatives thereof. Examples thereof include acrylic acid, methacrylic acid, itaconic acid, glycidyl acrylate and glycidyl methacrylate.

Examples thereof also include (meth)acrylic esters having a cyclic skeleton such as cycloalkyl ester acrylate, isobornyl acrylate, dicyclopentanyl acrylate, dicyclopentenyl acrylate, dicyclopentenyl oxyethyl acrylate and imido acrylate.

Examples of a monomer for the acrylic copolymer (A) also include alkyl(meth)acrylates in which an alkyl group has 1 to 18 carbon atoms such as methyl acrylate, methyl methacrylate, ethyl acrylate, ethyl methacrylate, propyl acrylate, propyl methacrylate, butyl acrylate and butyl methacrylate.

In addition to the aforementioned monomers, the acrylic copolymer (A) may be copolymerized with vinyl acetate, acrylonitrile, styrene and the like.

They can be used alone or in combination of two or more kinds thereof.

The content of the other monomer is, with respect to the entire acrylic copolymer (A), 0 to 77% by weight, preferably 0 to 70% by weight, more preferably 0 to 60% by weight.

As the "other monomer", the alkyl(meth)acrylate such as methyl acrylate is preferable from the point of good compatibility with an epoxy thermosetting resin.

The acrylic copolymer (A) has a weight average molecular weight of preferably 10,000 to 2,000,000, more preferably 100,000 to 1,500,000. It should be noted that the value of weight average molecular weight in the present specification is all based on the polystyrene equivalent by GPC method. If the acrylic copolymer (A) has a too low weight average molecular weight, the adhesive strength of the adhesive layer comprising the adhesive composition with the base material is high, and inferior picking-up may be caused in the aforementioned picking-up step. On the other hand, if it exceeds 2,000,000, the adhesive layer may not follow irregularities on the substrate in the aforementioned bonding step, and it is the cause of bringing about voids.

The acrylic polymer has a glass transition temperature falling in a range of preferably −30° C. to 50° C., more preferably −15° C. to 40° C. and particularly preferably −5° C. to 30° C. If the glass transition temperature is too low, a adhesive strength between the adhesive layer and the base material is increased, and inferior picking-up is caused in a certain case. On the other hand, if it is too high, the adhesive strength for fixing a wafer is likely to be unsatisfactory.

(B) Epoxy Thermosetting Resin:

As the epoxy thermosetting resin (B), various epoxy resins conventionally known can be used.

A content of the epoxy thermosetting resin (B) in the adhesive composition is preferably 1 to 1,500 parts by weight, and more preferably 3 to 1,000 parts by weight with respect to 100 parts by weight of the acrylic copolymer (A). When the content of the epoxy thermosetting resin (B) is less than 1 part by weight with respect to 100 parts by weight of the acrylic copolymer (A), the satisfactory adhesiveness is not obtained in a certain case. On the other hand, when it exceeds 1,500 parts by weight, the adhesive strength between the adhesive layer comprising the adhesive composition and the base material grows high, and inferior picking-up is brought about in a certain case.

As the epoxy resin (B), mention may be made of epoxy compounds having two or more functional groups in a molecule of the structural unit such as bisphenol A diglycidyl ether and hydrogenated compounds thereof, ortho-cresol novolak epoxy resins represented by the following Formula (2)), dicyclopentadiene type epoxy resins represented by the following Formula (3)), biphenyl type epoxy resins or biphenyl compounds represented by the following Formulae (4) or (5)).

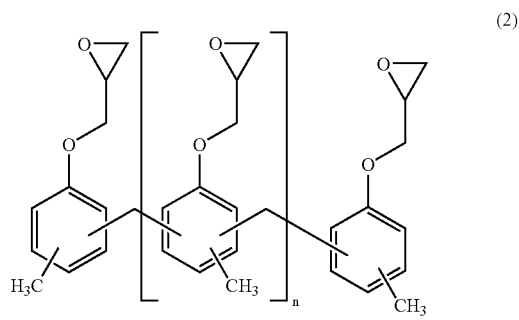

(2)

(wherein n is an integer of 0 or more),

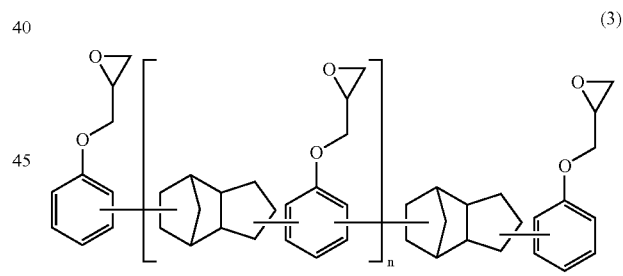

(3)

(wherein n is an integer of 0 or more),

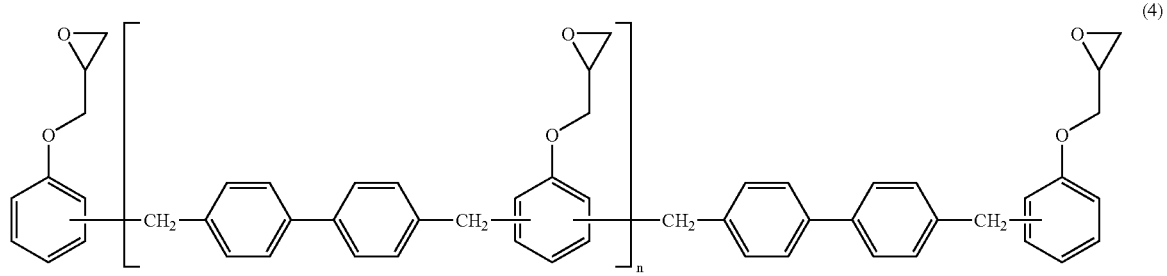

(4)

(wherein n is an integer of 0 or more),

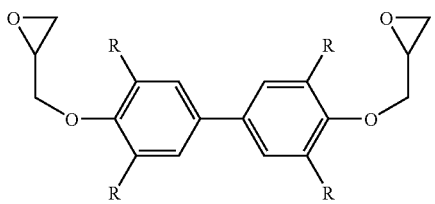

(5)

(wherein R is a hydrogen atom or a methyl group).

They can be used alone or in combination of two or more kinds thereof.

(C) Thermosetting Agent:

The thermosetting agent (C) functions as a thermosetting agent of the epoxy thermosetting resin (B). Examples of the preferred thermosetting agent (C) include compounds having two or more functional groups in a molecule which can react with an epoxy group, and examples of the functional group include a phenolic hydroxyl group, an alcoholic hydroxyl group, an amino group, a carboxyl group and an acid anhydride group. Among the above groups, a phenolic hydroxyl group, an amino group and an acid anhydride group are preferable, and a phenolic hydroxyl group and an amino group are more preferable.

The specific examples of them include phenolic thermosetting agents such as a novolak type phenol resin represented by the following Formula (6), a dicyclopentadiene phenol resin represented by the following Formula (7), a multifunctional phenol resin represented by the following Formula (8) and a aralkyl phenol resin represented by the following Formula (9) and amine thermosetting agents such as DICY (dicyanediamide). The above thermosetting agents can be used alone or in a mixture of two or more kinds thereof.

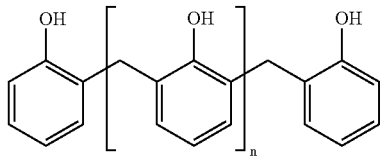

(6)

(wherein n represents an integer of 0 or more),

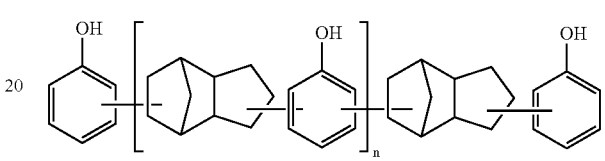

(7)

(wherein n represents an integer of 0 or more),

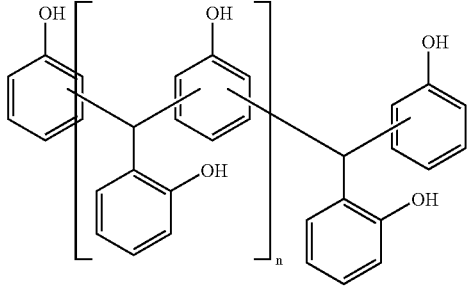

(8)

(wherein n represents an integer of 0 or more).

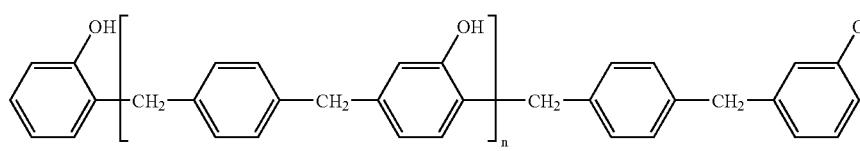

(9)

(wherein n represents an integer of 0 or more).

A content of the thermosetting agent (C) in the adhesive composition is preferably 0.1 to 500 parts by weight, more preferably 1 to 200 parts by weight with respect to 100 parts by weight of the epoxy thermosetting resin (B). If an amount of the thermosetting agent (C) is too small, the adhesiveness of the adhesive layer is not obtained in a certain case due to poor thermosetting of the adhesive composition, and if it is excessive, the moisture absorptivity of the adhesive composition grows high to reduce a reliability of the package in a certain case.

The adhesive composition according to the present invention comprises the acrylic copolymer (A), the epoxy thermo setting resin (B) and the thermosetting agent (C) as essential components, and it may further comprise the following components in order to improve a variety of the physical properties.

(D) Thermosetting Accelerating Agent:

The thermosetting accelerating agent (D) is used in order to adjust a thermosetting speed of the adhesive composition. Examples of the preferred thermosetting accelerating agent include compounds which can accelerate reaction of an epoxy group with a phenolic hydroxy group, amines and the like and, to be specific, tertiary amines such as triethylenediamine, benzyldimethylamine, triethanolamine, dimethylaminoethanol and tris(dimethylaminomethyl)phenol, imidazoles such as 2-methylimidazole, 2-phenylimidazole and 2-phenyl-4-methylimidazole, organic phosphines such as tributylphosphine, diphenylphosphine and triphenylphosphine and tetraphenylboron salts such as tetraphenylphosphonium tetraphenylborate and triphenylphosphine tetraphenylborate and the like.

They can be used alone or in a mixture of two or more kinds thereof.

Among them, imidazoles are preferable in enhancing adhesiveness.

When using the thermosetting accelerating agent (D), a content of the thermosetting accelerating agent (D) in the adhesive composition is usually preferably 0.001 to 100 parts by weight, more preferably 0.01 to 50 parts by weight and still more preferably 0.1 to 10 parts by weight with respect to 100 parts by weight of the epoxy thermosetting resin (B).

(E) Coupling Agent:

A coupling agent is used in order to enhance an adhesion of the adhesive composition to an adherend. Use of the coupling agent makes it possible to improve a water resistance of a cured product obtained by thermosetting the adhesive composition without damaging a heat resistance of the cured product. Compounds having groups which react with functional groups present in the acrylic copolymer (A) and the epoxy thermosetting resin (B) are preferably used as the coupling agent (E).

Specifically, the coupling agent (E) is preferably a silane coupling agent.

Examples of the above coupling agent include
γ-glycidoxypropyltrimethoxysilane,
γ-glycidoxypropylmethyldiethoxysilane,
β-(3,4-epoxycyclohexyl)ethyltrimethoxysilane,
γ-(methacrylopropyl)trimethoxysilane,
γ-aminopropyltrimethoxysilane,
N-6-(aminoethyl)-γ-aminopropyltrimethoxysilane,
N-6-(aminoethyl)-γ-aminopropylmethyldiethoxysilane,
N-phenyl-γ-aminopropyltrimethoxysilane,
γ-ureidopropyltriethoxysilane,
γ-mercaptopropyltrimethoxysilane,
γ-mercaptopropylmethyldimethoxysilane,
bis(3-triethoxysilylpropyl)tetrasulfane,
methyltrimethoxysilane, methyltriethoxysilane,
vinyltrimethoxysilane, vinyltriacetoxysilane and imidazolesilane and the like.

They can be used alone or in a mixture of two or more kinds thereof.

When using the coupling agent (E), a content of the coupling agent (E) in the adhesive composition is usually 0.1 to 20 parts by weight, preferably 0.2 to 10 parts by weight and more preferably 0.3 to 5 parts by weight with respect to 100 parts by weight of the sum of the acrylic copolymer (A) and the epoxy thermosetting resin (B). When it is less than 0.1 part by weight, the effects might not be obtained, and when it exceeds 20 parts by weight, out gas might occur.

(F) Cross-linking Agents

A cross-linking agent (F) can be added in order to control an initial adhesive strength and a cohesion of the adhesive composition. The cross-linking agent (F) includes organic polyvalent isocyanate compounds and organic polyvalent imine compounds and the like.

Examples of the organic polyvalent isocyanate compounds include aromatic polyvalent isocyanate compounds, aliphatic polyvalent isocyanate compounds, alicyclic polyvalent isocyanate compounds, trimers of the above polyvalent isocyanate compounds and end isocyanate urethane prepolymers obtained by reacting the above polyvalent isocyanate compounds with polyol compounds and the like.

More specific examples of the organic polyvalent isocyanate compounds include 2,4-tolylenediisocyanate, 2,6-tolylenediisocyanate, 1,3-xylylenediisocyanate, 1,4-xylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2,4'-diisocyanate, trimethylolpropane adduct toluylenediisocyanate and lysineisocyanate and the like.

Specific examples of the organic polyvalent imine compounds include N,N'-diphenylmethane-4,4'-bis(1-aziridinecarboxyamide), trimethylolpropane-tri-β-aziridinyl propionate, tetramethylolmethane-tri-β-aziridinyl propionate and N,N'-toluene-2,4-bis(1-aziridinecarboxyamide)triethylenemelamine and the like.

They can be used alone or in combination of two or more kinds thereof.

When using the cross-linking agent (F), a content of the cross-linking agent (F) is usually 0.01 to 10 parts by weight, preferably 0.1 to 5 parts by weight and more preferably 0.5 to 3 parts by weight with respect to 100 parts by weight of the acrylic copolymer (A).

(G) Energy Beam-polymerizable Compound:

The adhesive composition of the present invention may be blended with an energy beam-polymerizable compound (G).

The adhesive strength of the adhesive layer can be reduced by curing the energy beam-polymerizable compound (G) by irradiation with an energy beam and thus interlayer separation between the base material and the adhesive layer in transferring an IC chip to a bonding step can readily be carried out. It should be noted that, since the adhesive strength between the adhesive layer and the chip is usually greater than that between a base material and the adhesive layer, the IC chip is not separated from the adhesive layer during the interlayer peeling.

The energy beam-polymerizable compound (G) is a compound which is polymerized and cured by irradiation with an energy beam such as a UV ray and an electron beam.

Specific examples of the energy beam-polymerizable compound (G) include acrylate base compounds such as dicyclopentadiene dimethoxy diacrylate, trimethylolpropane triacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, oligo ester acrylate, urethane acrylate oligomers, epoxy-modified acrylate, polyether acrylate and itaconic acid oligomers.

These compounds have at least one polymerizable double bond, and they have a weight average molecular weight of usually 100 to 30,000, preferably 300 to about 10,000.

They can be used alone or in combination of two or more kinds thereof.

When using the energy beam-polymerizable compound (G), a content of the energy beam-polymerizable compound (G) is usually 1 to 400 parts by weight, preferably 3 to 300 parts by weight and more preferably 3 to 200 parts by weight with respect to 100 parts by weight of the acrylic copolymer (A). If it exceeds 400 parts by weight, the adhesiveness of the adhesive layer to an organic substrate and a lead frame is reduced in a certain case.

(H) Photopolymerization Initiator:

In using the adhesive composition of the present invention, it is irradiated with an energy beam such as a UV ray to reduce an adhesive strength in a certain case. In this case, addition of a photopolymerization initiator (H) to the above composition makes it possible to reduce the polymerization and curing time and the beam irradiation dose.

Specific examples of the photopolymerization initiator (H) include benzophenone, acetophenone, benzoin, benzoin methyl ether, benzoin ethyl ether, benzoin isopropyl ether, benzoin isobutyl ether, benzoin benzoate, benzoin methyl benzoate, benzoin dimethyl ketal, 2,4-diethylthioxanthone, α-hydroxycyclohexyl phenyl ketone, benzyl diphenyl sulfide, tetramethylthiuram monosulfide, azobisisobutyronitrile, and β-chloroanthraquinone. The photopolymerization initiator (H) can be used alone or in combination of two or more kinds thereof.

A blending proportion of the photopolymerization initiator (H) has to be determined, to be theoretical, based on an amount of an unsaturated bond present in the adhesive, a reactivity thereof and a reactivity of the photopolymerization initiator used, but it is not necessarily easy in a complicated mixture system.

When using the photopolymerization initiator (H), a content of the photopolymerization initiator (H) is, as a general guideline, preferably 0.1 to 10 parts by weight, more preferably. 1 to 5 parts by weight with respect to 100 parts by weight of the energy beam-polymerizable compound (G). If it is less than 0.1 part by weight, the satisfactory picking-up property is not obtained due to lack of photopolymerization in a certain case. If it exceeds 10 parts by weight, residues which do not contribute to the photopolymerization are produced, and a curing property of the adhesive is unsatisfactory in a certain case.

(I) Inorganic Filler:

Blending of the adhesive with an inorganic filler (I) makes it possible to control the thermal expansion coefficient, and optimization of a thermal expansion coefficient of the adhesive layer to be inserted after cured to an IC chip having a thermal expansion coefficient different from a thermal expansion coefficient of a substrate made of a metal or organic resin makes it possible to enhance a reliability of the package. Further, a moisture absorptivity of the adhesive layer after cured can be reduced.

Examples of the preferred inorganic filler include powders of silica, alumina, talc, calcium carbonate, titan white, red iron oxide, silicon carbide, boron nitride and the like, beads obtained by sphering the above compounds, monocrystalline fibers, amorphous fibers and the like.

They can be used alone or in a mixture of two or more kinds thereof.

In the present invention, among them, silica powder and alumina powder are preferably used.

The amount of the inorganic filler (I) can be controlled in a range of usually 0 to 80% by weight based on the whole adhesive composition.

Other Components:

The adhesive composition of the present invention may be blended, if necessary, with various additives in addition to the components described above.

For example, a flexible component can be added in order to maintain the flexibility of the adhesive layer after cured. The flexible component is a component which has flexibility at room temperature and under heating, and what is not substantially cured by heating or irradiating with an energy beam is selected.

The flexible component may be a polymer comprising a thermoplastic resin or an elastomer or may be a graft component of a polymer or a block component of a polymer. Further, the flexible component may be a modified resin which is modified in advance with an epoxy resin.

Further, a plasticizer, an antistatic agent, an antioxidant, a pigment, a dye and the like may be used as the various additives for the adhesive composition.

The adhesive composition comprising the components described above has an adhesiveness and a thermosetting property, and the composition in a non-cured state has a function of temporarily holding various adherends. It can provide finally a cured product having a high impact resistance through thermosetting, and in addition thereto, it is excellent in a balance between a shearing strength and a peeling strength and can maintain a satisfactory adhesive property even when exposed to a severe hot and humid condition.

The adhesive composition according to the present invention is obtained by mixing the respective components described above in suitable proportions. In mixing, the above components may be diluted in advance by a solvent or the solvent may be added in mixing.

Adhesive Sheet:

According to the present invention, there is provided an adhesive sheet using the adhesive composition described above.

The adhesive sheet according to the present invention (hereinafter also referred to merely as "the adhesive sheet") comprises a base material and, formed thereon, an adhesive layer comprising the adhesive composition described above. The adhesive sheet according to the present invention can have all forms such as a tape form, a label form and the like.

Base Material

Used as the base material for the adhesive sheet are, for example, transparent films such as a polyethylene film, a polypropylene film, a polybutene film, a polybutadiene film, a polymethylpentene film, a polyvinyl chloride film, a polyvinyl chloride copolymer film, a polyethylene terephthalate film, a polyethylene naphthalate film, a polybutylene terephthalate film, a polyurethane film, an ethylene vinyl acetate copolymer film, an ionomer resin film, an ethylene(meth)acrylic acid copolymer film, an ethylene(meth)acrylic ester copolymer film, a polystyrene film, a polycarbonate film, a polyimide film and the like.

Also, cross-linked films thereof may be used as well. Further, laminated films thereof may be used.

In addition to the transparent films described above, opaque films obtained by coloring the above films, fluororesin films and the like can be used. However, when irradiation with an energy beam such as UV ray from a base material side is performed in using the adhesive sheet according to the present invention, the base material is preferably transmittable to the energy beam used.

The adhesive sheet according to the present invention is adhered on various adherends, and after the adherends are subjected to required processing such as dicing, the adhesive layer is separated from the base material while firmly adhering and remaining on the adherend. Accordingly, a face of the base material brought into contact with the adhesive layer has a surface tension of preferably 40 mN/m or less, more preferably 37 mN/m or less and particularly preferably 35 mN/m or less. The base material having such a low surface tension can be obtained by suitably selecting materials, and it can be obtained as well by subjecting the surface of the base material to peeling treatment by coating a releasing agent on it.

Releasing agents of an alkid base, a silicone base, a fluorine base, an unsaturated polyester base, a polyolefin base and a wax base are used as the releasing agent used for the peeling treatment of the base material. In particular, the releasing agents of an alkid base, a silicone base and a fluorine base are preferred since they have a heat resistance.

In order to subject the surface of the base material to peeling treatment with the releasing agent, the releasing agent without dissolving in a solvent or the releasing agent which is diluted or emulsified with a solvent is applied by means of a gravure coater, a Mayor bar coater, an air knife coater, a roll coater and the like and cured at room temperature or by heating or by irradiating with an electron beam, or a laminate is formed by wet lamination, dry lamination, hot melt lamination, melt extrusion lamination, coextrusion working and the like.

The base material has a film thickness of usually about 10 to 500 µm, preferably about 15 to 300 µm and particularly preferably about 20 to 250 µm.

The adhesive layer has a thickness of usually about 1 to 500 µm, preferably about 5 to 300 µm and particularly preferably about 10 to 150 µm.

Production Process for the Adhesive Sheet

The adhesive sheet according to the present invention is produced from the base material and the adhesive composition described above.

A production process for the adhesive sheet shall not specifically be restricted. It may be produced by coating the adhesive composition constituting the adhesive layer on a base material and drying it or may be produced by providing the adhesive layer on a release film and transferring it onto the base material. A release film may be laminated on an upper face of the adhesive layer in order to protect the adhesive layer before using the adhesive sheet. Furthermore, a pressure sensitive adhesive layer may be separately provided at an outer circumferential part of the surface of the adhesive layer in order to fix jigs such as a ring frame.

Production Process for a Semiconductor Device using the Adhesive Sheet

According to the present invention, a production process for a semiconductor device using the aforementioned adhesive sheet is also provided.

In the production processes for a semiconductor device according to the present invention, the adhesive sheet according to the present invention is fixed on a dicing equipment with a ring frame, and one face of a silicon wafer is placed on the adhesive layer of the adhesive sheet and slightly pressed to fix the wafer.

Then, when the adhesive composition contains the energy beam-polymerizable compound (G), the adhesive layer is irradiated with an energy beam from a base material side to enhance a cohesion of the adhesive layer, whereby an adhesive strength between the adhesive layer and the base material is reduced. An ultraviolet ray (UV), an electron beam (EB) or the like is used as the energy beam irradiated, and a UV ray is preferably used.

Then, the silicon wafer described above is cut by means of a cutting means such as a dicing saw to obtain IC chips. In this case, the cut depth is a depth determined by adding the total of a thickness of the silicon wafer and a thickness of the adhesive layer and an abraded part of the dicing saw.

Irradiation with an energy beam may be carried out at any stage of after adhering the semiconductor wafer and before separating the IC chip. It may be carried out, for example, after dicing or may be carried out after an expanding step described below. Further, irradiation with an energy beam may be carried out dividing into plural times.

Then, expanding of the adhesive sheet carried out if necessary enlarges an interval between the IC chips to cause deviation between the adhesive layer and the base material, whereby an adhesive strength between the adhesive layer and the base material is reduced, and as a result, picking-up of the IC chip is readily carried out.

Picking-up of the IC chip carried out in the manner described above makes it possible to separate the adhesive layer from the base material while firmly adhering the cut adhesive layer on a back face of the IC chip to allow it to remain thereon. Examples of method for separating the adhesive layer from the base material include peeling the adhesive layer from the base material.

Then, the IC chip is mounted on a die pad part through the adhesive layer. The die pad part is heated before mounting the IC chip or immediately after mounting. The heating temperature is usually 80 to 200° C., preferably 100 to 180° C. The heating time is usually 0.1 seconds to 5 minutes, preferably 0.5 seconds to 3 minutes, and the chip mounting pressure is usually 1 kPa to 200 MPa.

After the IC chip is chip-mounted on the die pad part, it may be further heated if necessary. In this case, the heating condition falls in the range of the heating temperature described above, and the heating time is usually 1 to 180 minutes, preferably 10 to 120 minutes. The heating may be substituted with heating in sealing the resin. The conditions for this heating are approximately at 150 to 180° C. for 2 to 8 hours.

The semiconductor device is produced by passing through these steps. The adhesive layer is cured by passing through the above steps, and the IC chip can firmly be adhered onto the die pad part. The adhesive layer is fluidized under a die bonding condition, and therefore it is sufficiently embedded into irregularities of the die pad part and can prevent voids from being produced.

That is, in the mounted product obtained, the adhesive layer which is a firmly adhering means for the IC chip is cured and is sufficiently embedded into the irregularities of the die pad part, and therefore the satisfactory package reliability and board mounting property are achieved even under severe conditions.

The adhesive composition and the adhesive sheet according to the present invention can be used as well for adhering semiconductor compounds, glass, ceramics, metals and the like in addition to the applications described above.

EXAMPLES

Hereinbelow, the present invention shall be explained in detail with reference to examples, but the present invention shall not be restricted to these examples. In the following examples and comparative examples, "evaluation of a surface mounting property" was carried out in the following manner.

Evaluation of Surface Mounting Property:

(1) Production of Semiconductor Chip

Adhesive sheets comprising a base material and, formed thereon, an adhesive layer prepared in the examples and the comparative examples were adhered on a ground surface of a #2000 ground silicon wafer (150 mm diameter and thickness 150 μm) by means of a tape mounter (Adwill RAD2500, manufactured by Lintec Corporation), and the wafer was fixed at a ring frame for wafer dicing.

Then irradiation (350 mW/cm$^2$, 190 mJ/cm$^2$) with a UV ray from the base material side by means of a UV ray irradiating equipment (Adwill RAD200, manufactured by Lintec Corporation) was carried out.

Then, the wafer was diced into a chip size of 8 mm×8 mm by means of a dicing equipment (DFD651, manufactured by DISCO CORPORATION). A cut amount in dicing was such that the base material was cut into by 20 μm.

(2) Production of Semiconductor Package

Used as a substrate was a substrate (manufactured by Chino Giken Co., Ltd.) in which circuit patterns were formed at a copper foil (thickness 18 μm) of a copper foil-clad laminate (CCL-HL830, manufactured by Mitsubishi Gas Chemical Co., Inc.) and in which a solder resist (PSR4000 AUS5, manufactured by Taiyo Ink MFG. Co., Ltd.) was provided on the patterns.

The chip obtained in (1) described above on the adhesive sheet was taken up from the base material together with the adhesive layer, and it was pressed and bonded on the substrate through the adhesive layer on the conditions of 12° C., 100 gf and 1 second. Then, the substrate was sealed with a mold resin (KE-1100AS3, manufactured by KYOCERA Chemical Corporation) so that a sealing thickness was 400 μm (sealing equipment: MPC-06M Trial Press, manufactured by APIC YAMADA CORPORATION), and the mold resin was cured at 175° C. for 5 hours.

Then, the substrate sealed was adhered on a dicing tape (Adwill D-510T, manufactured by Lintec Corporation) and diced into a size of 12 mm×12 mm by means of the dicing equipment (DFD651, manufactured by DISCO CORPORATION), whereby a semiconductor package for evaluating reliability was obtained.

(3) Evaluation of Surface Mounting Property of Semiconductor Package

The semiconductor package obtained was left standing for 168 hours under the condition of 85° C. and 60% RH and allowed to absorb moisture, and then IR reflow (reflow furnace: WL-15-20DNX, manufactured by Sagami-Rikou Co., Ltd.) was carried out three times at a maximum temperature of 260° C. and a heating time of 1 minute to evaluate the presence of floating and peeling from the adhesive layer of the IC chip and the presence of cracks produced in the package by means of a scanning type ultrasonic flaw detector (Hye-Focus, manufactured by Hitachi Kenki Fine Tech and Co., Ltd.) and observation of the cross-section.

A case in which peeling of 0.5 mm or more was observed at the adhered part of the semiconductor chip and the substrate was judged as peeling, and 25 pieces of the packages were subjected to the test to count the number of the packages which did not bring about peeling.

(4) Measurement of the Rate of Adhesive Strength Degradation by Heat and Humidity:

Adhesive sheets prepared in Examples and Comparative Examples were laminated onto an ground surface of a #2000 ground silicon wafer (having a diameter of φ150 mm and cut into ¼ with a thickness of 150 μm), using a laminator (laminator manufactured by Taisei Laminator Co., Ltd.) at 40° C. and at a rate of 0.5 m/min. Then, the base material of the adhesive sheet was peeled off and a copper plate having a thickness of 150 μm (10 mm×50 mm, wiped with toluene and dried at room temperature for two hours) was laminated on the adhesive layer using the same laminator at 80° C. and at a rate of 0.5 m/min. Subsequently heating and thermosetting was carried out under air at 175° C. for 5 hours.

adhesive strength of the prepared sample was measured before and after leaving it at 85° C. and 85% RH for 168 hours. A measurement was performed under the conditions of 23° C. and 50% RH by using a universal tensile testing machine (Autograph AG-IS manufactured by Shimadzu Corporation), and force required to peel off the copper plate at an angle of 90° and at a rate of 50 mm/min (peel strength) was measured while the wafer was fixed. (1−(peel strength after leaving)/(peel strength before leaving))×100 (%) was determined as the rate of adhesive strength degradation by heat and humidity.

Furthermore, the components constituting the adhesive composition are as follows.

(A) Acrylic Copolymer:

Benzyl acrylate (85 g) and 2-hydroxyethyl acrylate (15 g) as a monomer, α,α'-azobisisobutyronitrile (0.2 g) as a polymerization initiator and toluene (60 g) and ethyl acetate (60 g) as a solvent were mixed and the resultant mixture was stirred under nitrogen atmosphere at 60° C. for 24 hours to obtain acrylic copolymer (A)-1. Furthermore, (A)-2 to (A)-7 below were also obtained by a similar operation to that of (A) -1 except for changing the kind and weight ratio of the monomers of acrylic copolymers as follows. Therefore, the total weight of the monomer used to obtain (A)-2 to (A)-7 was all 100 g.

(A)-1: Acrylic copolymer consisting of benzyl acrylate/2-hydroxyethyl acrylate (85% by weight/15% by weight) whose weight average molecular weight is around 500000.

(A)-2: Acrylic copolymer consisting of methyl acrylate/benzyl acrylate/2-hydroxyethyl acrylate (25% byweight/60% byweight/15% by weight) whose weight average molecular weight is around 500000.

(A)-3: Acrylic copolymer consisting of methyl acrylate/benzyl acrylate/2-hydroxyethyl acrylate (45% byweight/40% byweight/15% by weight) whose weight average molecular weight is around 500000.

(A)-4: Acrylic copolymer consisting of methyl acrylate/benzyl acrylate/2-hydroxyethyl acrylate (55% byweight/30% by weight/15% by weight) whose weight average molecular weight is around 500000.

(A)-5: Acrylic copolymer consisting of methyl acrylate/2-hydroxyethyl acrylate (85% by weight/15% by weight) whose weight average molecular weight is around 500000.

(A)-6: Acrylic copolymer consisting of benzyl acrylate/2-hydroxyethyl acrylate (98% by weight/2% by weight) whose weight average molecular weight is around 500000.

(A)-7: Acrylic copolymer consisting of methyl acrylate/benzyl acrylate/2-hydroxyethyl acrylate (70% byweight/15% byweight/15% by weight) whose weight average molecular weight is around 500000.

The adhesive sheets thus obtained were used to evaluate a surface mounting property and rate of adhesive strength degradation by heat and humidity. The results thereof are shown in Table 2.

TABLE 1

| Component | Example 1 | Example 2 | Example 3 | Example 4 | Example 5 | Example 6 | Comparative Example 1 | Comparative Example 2 | Comparative Example 3 | Comparative Example 4 |
|---|---|---|---|---|---|---|---|---|---|---|
| (A)-1 | 100 | 100 | | | | | | | | |
| (A)-2 | | | 100 | | | | | | | |
| (A)-3 | | | | 100 | 100 | | | | | |
| (A)-4 | | | | | | 100 | | | | |
| (A)-5 | | | | | | | 100 | 100 | | |
| (A)-6 | | | | | | | | | 100 | |
| (A)-7 | | | | | | | | | | 100 |
| B | 19 | 19 | 19 | 19 | 19 | 19 | 19 | 19 | 19 | 19 |
| C | 10 | 10 | 10 | 10 | 10 | 10 | 10 | 10 | 10 | 10 |
| D | 0.5 | 0.5 | 0.5 | 0.5 | 0.5 | 0.5 | 0.5 | 0.5 | 0.5 | 0.5 |
| E | 0.5 | 0.5 | 0.5 | 0.5 | 0.5 | 0.5 | 0.5 | 0.5 | 0.5 | 0.5 |
| F | 0.5 | 0.5 | 0.5 | 0.5 | 0.5 | 0.5 | 0.5 | 0.5 | 0.5 | 0.5 |
| G | | 10 | | | 10 | | | 10 | | |
| H | | 0.4 | | | 0.4 | | | 0.4 | | |

Unit: parts by weight (value reduced to a solid content)

(B) Epoxy thermosetting resin: Bisphenol A diglycidyl ether (Epicoat 828, epoxy equivalent: 189 g/eq, manufactured by Japan Epoxy Resins Co., Ltd.)
(C) Themosetting agent: Novolak type phenol resin (Shonol BRG-556, phenolic hydroxyl equivalent: 104 g/eq, manufactured by Showa Highpolymer Co., Ltd.)
(D) Themosetting accelerating agent: Imidazole (Curezol 2PHZ, manufactured by Shikoku Chemicals Corporation)
(E) Silane coupling agent (MKC Silicate MSEP2, manufactured by Mitsubishi Chemical Corporation)
(F) Cross-linking agent: Aromatic polyisocyanate (Coronate L, manufactured by Nippon Polyurethane Industry Co., Ltd.)
(G) Energy beam-polymerizable compound: Bifunctional acrylate (KAYARAD R-684, manufactured by Nippon Kayaku Co., Ltd.)
(H) Photopolymerization initiator (Irgacure 184, manufactured by Ciba Specialty Chemicals K. K.)

A polyethylene film (thickness: 100 μm, surface tension: 33 mN/m) was used as a base material for the adhesive sheet.

EXAMPLES AND COMPARATIVE EXAMPLES

Adhesive compositions having compositions shown in Table 1 were used. The adhesive compositions were obtained by mixing components shown in the Table 1. In the table, numerical values show parts by weight in terms of a solid content.

The adhesive compositions having the compositions shown in Table 1 were applied on a release film (SP-PET3811 (S), manufactured by Lintec Corporation) subjected to silicone treatment and dried in an oven at 100° C. for one minute. The thickness of the adhesive layers obtained by drying was 30 μm. Then they were stuck onto base materials having a thickness of 100 μm to transfer the adhesive layers on the base materials, whereby adhesive sheets were obtained.

TABLE 2

| | Evaluation results of surface mounting property* | Rate of adhesive strength degradation by heat and humidity |
|---|---|---|
| Example 1 | 25/25 | 6 |
| Example 2 | 25/25 | 17 |
| Example 3 | 25/25 | 15 |
| Example 4 | 25/25 | 10 |
| Example 5 | 25/25 | 13 |
| Example 6 | 25/25 | 14 |
| Comparative Example 1 | 5/25 | 47 |
| Comparative Example 2 | 7/25 | 51 |
| Comparative Example 3 | 4/25 | 7 |
| Comparative Example 4 | 6/25 | 45 |

*number of the packages which did not cause floating and peeling at the adhered part and did not have package cracks/ number of the packages subjected to the test

What is claimed is:

1. An adhesive composition comprising an acrylic copolymer (A) containing 20 to 95% by weight of a structural unit derived from a benzyl(meth)acrylate, an epoxy thermosetting resin (B), and a thermosetting agent (C),
   wherein the acrylic copolymer (A) contains 3 to 50% by weight of a structural unit derived from a (meth)acrylic ester having a hydroxyl group, and
   wherein the thermosetting agent (C) has two or more functional groups independently selected from the group consisting of a phenolic hydroxyl group, an alcohol hydroxyl group, an amino group, a carboxylic group and an acid anhydride group in a molecule.

2. An adhesive sheet comprising a base material and, separably formed thereon, an adhesive layer comprising an acrylic copolymer (A) containing 20 to 95% by weight of a structural unit derived from a benzyl(meth)acrylate, an epoxy thermosetting resin (B), and a thermosetting agent (C),
   wherein the acrylic copolymer (A) contains 3 to 50% by weight of a structural unit derived from a (meth)acrylic ester having a hydroxyl group, and wherein the thermosetting agent (C) has two or more functional groups independently selected from the group consisting of a phenolic hydroxyl group, an alcohol hydroxyl group, an amino group, a carboxylic group and an acid anhydride group in a molecule.

* * * * *